United States Patent
Ogawa et al.

(10) Patent No.: US 9,721,663 B1
(45) Date of Patent: Aug. 1, 2017

(54) WORD LINE DECODER CIRCUITRY UNDER A THREE-DIMENSIONAL MEMORY ARRAY

(71) Applicant: SANDISK TECHNOLOGIES INC., Plano, TX (US)

(72) Inventors: Hiroyuki Ogawa, Yokkaichi (JP); Fumiaki Toyama, Cupertino, CA (US); Takuya Ariki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/046,740

(22) Filed: Feb. 18, 2016

(51) Int. Cl.
*G11C 16/04* (2006.01)
*G11C 16/08* (2006.01)
(Continued)

(52) U.S. Cl.
CPC .......... *G11C 16/08* (2013.01); *G11C 16/0483* (2013.01); *H01L 23/5226* (2013.01);
(Continued)

(58) Field of Classification Search
CPC ..... G11C 11/4097; G11C 16/14; G11C 5/063; G11C 7/02; G11C 7/18; G11C 8/08;
(Continued)

(56) References Cited

U.S. PATENT DOCUMENTS 5,915,167 A 6/1999 Leedy
6,881,994 B2 4/2005 Lee et al.
(Continued)

FOREIGN PATENT DOCUMENTS

JP H04-079369 3/1992
WO WO02/15277 A2 2/2002
WO 2014066829 A1 5/2014

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Hien Nguyen
(74) *Attorney, Agent, or Firm* — The Marbury Law Group PLLC

(57) ABSTRACT

The total chip area for a three-dimensional memory device can be reduced employing a design layout in which the word line decoder circuitry is formed underneath an array of memory stack structures. The interconnection between the word lines and the word line decoder circuitry can be provided by forming discrete word line contact via structures. The discrete word line contact via structures can be formed by employing multiple sets of etch masks with overlapping opening areas and employed to etch a different number of pairs of insulating layers and electrically conductive layers, thereby obviating the need to form staircase regions having stepped surfaces. Sets of at least one conductive interconnection structure can be employed to provide vertical electrical connection to the word line decoder circuitry. Bit line drivers can also be formed underneath the array of memory stack structures to provide greater areal efficiency.

33 Claims, 9 Drawing Sheets

(51) Int. Cl.
*H01L 27/1157* (2017.01)
*H01L 27/11582* (2017.01)
*H01L 27/11524* (2017.01)
*H01L 27/11556* (2017.01)
*H01L 23/522* (2006.01)
*H01L 23/528* (2006.01)

(52) U.S. Cl.
CPC ...... *H01L 23/5283* (2013.01); *H01L 27/1157* (2013.01); *H01L 27/11524* (2013.01); *H01L 27/11556* (2013.01); *H01L 27/11582* (2013.01)

(58) Field of Classification Search
CPC . G11C 16/0408; G11C 16/0483; G11C 16/08; G11C 16/10
See application file for complete search history.

(56) References Cited

U.S. PATENT DOCUMENTS

| | | | |
|---|---|---|---|
| 7,005,350 | B2 | 2/2006 | Walker et al. |
| 7,023,739 | B2 | 4/2006 | Chen et al. |
| 7,135,726 | B2 | 11/2006 | Endoh et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,679,133 | B2 * | 3/2010 | Son .............. H01L 21/8221 257/328 |
| 7,696,559 | B2 | 4/2010 | Arai et al. |
| 7,745,265 | B2 | 6/2010 | Mokhlesi et al. |
| 7,746,680 | B2 | 6/2010 | Scheuerlein et al. |
| 7,808,038 | B2 | 10/2010 | Mokhlesi et al. |
| 7,848,145 | B2 * | 12/2010 | Mokhlesi ......... H01L 27/11568 365/185.05 |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,394,716 | B2 | 3/2013 | Hwang et al. |
| 8,643,142 | B2 | 2/2014 | Higashitani et al. |
| 8,823,076 | B2 | 9/2014 | Lee et al. |
| 8,853,765 | B2 | 10/2014 | Lee et al. |
| 8,901,704 | B2 | 12/2014 | Kang |
| 8,923,048 | B2 * | 12/2014 | Rabkin ............... H01L 29/6675 365/185.05 |
| 9,023,719 | B2 | 5/2015 | Pachamuthu et al. |
| 9,269,445 | B1 * | 2/2016 | Abe .................... G11C 16/10 |
| 2002/0036308 | A1 | 3/2002 | Endoh et al. |
| 2005/0117443 | A1 | 6/2005 | Park et al. |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0019310 | A1 | 1/2010 | Sakamoto |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0254191 | A1 | 10/2010 | Son et al. |
| 2010/0320528 | A1 | 12/2010 | Jeong et al. |
| 2011/0031630 | A1 | 2/2011 | Hashimoto |
| 2011/0051492 | A1 | 3/2011 | Toda |
| 2011/0076819 | A1 | 3/2011 | Kim et al. |
| 2011/0133606 | A1 | 6/2011 | Yoshida et al. |
| 2011/0220987 | A1 | 9/2011 | Tanaka et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0119287 | A1 | 5/2012 | Park et al. |
| 2012/0223380 | A1 | 9/2012 | Lee et al. |
| 2013/0126957 | A1 * | 5/2013 | Higashitani ....... H01L 27/11519 257/314 |
| 2013/0127011 | A1 | 5/2013 | Higashitani et al. |
| 2013/0264631 | A1 | 10/2013 | Alsmeier et al. |
| 2014/0225180 | A1 | 8/2014 | Lee et al. |
| 2015/0076584 | A1 | 3/2015 | Pachamuthu et al. |
| 2015/0179660 | A1 | 6/2015 | Yada et al. |
| 2016/0027793 | A1 | 1/2016 | Yip et al. |
| 2016/0035423 | A1 * | 2/2016 | Nam .................... G11C 16/08 365/185.11 |
| 2016/0163386 | A1 * | 6/2016 | Hwang ................ G11O 5/025 365/185.05 |
| 2016/0204102 | A1 * | 7/2016 | Chen .................. H01L 27/0688 257/774 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

Non-Final Office Communication for U.S. Appl. No. 14/739,284, filed Jun. 15, 2015, dated Apr. 8, 2016, 10 pages.

U.S. Appl. No. 14/291,415, filed May 30, 2014, SanDisk Technologies Inc.

U.S. Appl. No. 14/517,134, filed Oct. 17, 2014, SanDisk Technologies Inc.

U.S. Appl. No. 14/723,868, filed May 28, 2015, SanDisk Technologies Inc.

U.S. Appl. No. 14/739,284, filed Jun. 15, 2015, SanDisk Technologies Inc.

U.S. Appl. No. 14/739,354, filed Jun. 15, 2015, SanDisk Technologies Inc.

ntemational Search Report and Written Opinion, International Application No. PCT/US2016/067621, issued Apr. 18, 2017, 18pgs.

* cited by examiner

WORD LINE DECODER CIRCUITRY UNDER A THREE-DIMENSIONAL MEMORY ARRAY

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

Referring to FIG. 1, a layout of a prior art three-dimensional (3D) NAND chip is illustrated in which the word line decoder circuitry and the bit line decoder circuitry are located in areas that are separate from the area of the array of memory cells. A 3D NAND bank (which is also referred to as a 3D NAND plane or a page) is located a rectangular area. Word line decoder circuitry (which is also referred to as a row decoder circuitry, or a "ROWDEC circuitry") controls the voltages applied to the word lines of the 3D NAND bank. Staircase regions can be provided adjacent to the 3D NAND bank so that vertical contact via structures to the word lines can be formed in the staircase areas. Metal lines (schematically illustrated as horizontal lines between pairs of a staircase region and a word line decoder circuitry) can provide electrical connection between the word lines of the 3D NAND bank and the word line decoder circuitry. A sense amplifier circuitry (which is also referred to as a bit line decoder circuitry or a "page buffer" circuitry) controls voltage applied to the bit lines (which are schematically illustrated as vertical lines extending over the 3D NAND bank and to the sense amplifier circuitry) controls voltages applied to the bit lines, detects the status of individual memory cells within the 3D NAND bank (for example, during a read operation), and latches the status of the individual memory cells. The word line decoder circuitry can be embodied as two blocks of peripheral device regions located adjacent to the staircase regions, and the sense amplifier circuitry can be located in an area that is 90 degrees rotated from one of the word line decoder circuitry areas to enable connection with all of the bit lines.

The areas of the word line decoder circuitry and the sense amplifier circuitry are not negligible as a fraction of the entire area of the semiconductor chip. The total areas of the word line decoder circuitry and the sense amplifier circuitry can easily exceed 20% of the total chip area, and may exceed 30% of the total chip area for some 3D NAND memory products. The total areas of the word line decoder circuitry and the sense amplifier circuitry as a fraction of the total area of a 3D NAND memory chip is expected to increase even further as the total number of word lines (as implemented as electrically conductive layers in a vertical stack) increases in a high density 3D NAND memory device. Thus, it is desirable to reduce the fraction of the areas that are employed for the word line decoder circuitry and the sense amplifier circuitry over the total chip area in a 3D NAND memory device.

SUMMARY

According to an aspect of the present disclosure, a memory device is provided, which comprises: an alternating stack of insulating layers and electrically conductive layers located over a substrate; an array of memory stack structures extending through the alternating stack, wherein each of the memory stack structures comprises charge storage regions and a vertical semiconductor channel, and the electrically conductive layers comprise word lines for the memory stack structures; and a word line decoder circuitry including switches for activating a respective word line for the memory stack structures, and located underneath the array of memory stack structures and above the substrate. The memory device further comprises: a word line vertical interconnection region including multiple sets of at least one conductive interconnection structure, each set of at least one conductive interconnection structure electrically contacting a node of a respective device in the word line decoder circuitry; bit lines electrically connected to the vertical semiconductor channels through respective drain regions and extending over the array of memory stack structures; and upper-interconnect-level word line connectors extending parallel to the bit lines over a portion of the array of memory stack structures, and electrically connecting a respective set of at least one conductive interconnection structure to the electrically conductive layers.

According to another aspect of the present disclosure, a method of forming a memory device is provided. A word line decoder circuitry is formed over a substrate. A memory cell array is formed over the word line decoder circuitry. The memory cell array includes an alternating stack of insulating layers and electrically conductive layers and an array of memory stack structures extending through the alternating stack. Each of the memory stack structures comprises charge storage regions and a vertical semiconductor channel. The electrically conductive layers comprise word lines for the memory stack structures. The word line decoder circuitry includes switches for activating a respective word line for the memory stack structures. A word line vertical interconnection region including multiple sets of at least one conductive interconnection structure is formed. Each set of at least one conductive interconnection structure contacts a node of a respective device in the word line decoder circuitry. Bit lines are formed, which are electrically connected to the vertical semiconductor channels through respective drain regions and extend over the array of memory stack structures. Upper-interconnect-level word line connectors are formed extending parallel to the bit lines over a portion of the array of memory stack structures, and electrically connecting a respective set of at least one conductive interconnection structure to the electrically conductive layers.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
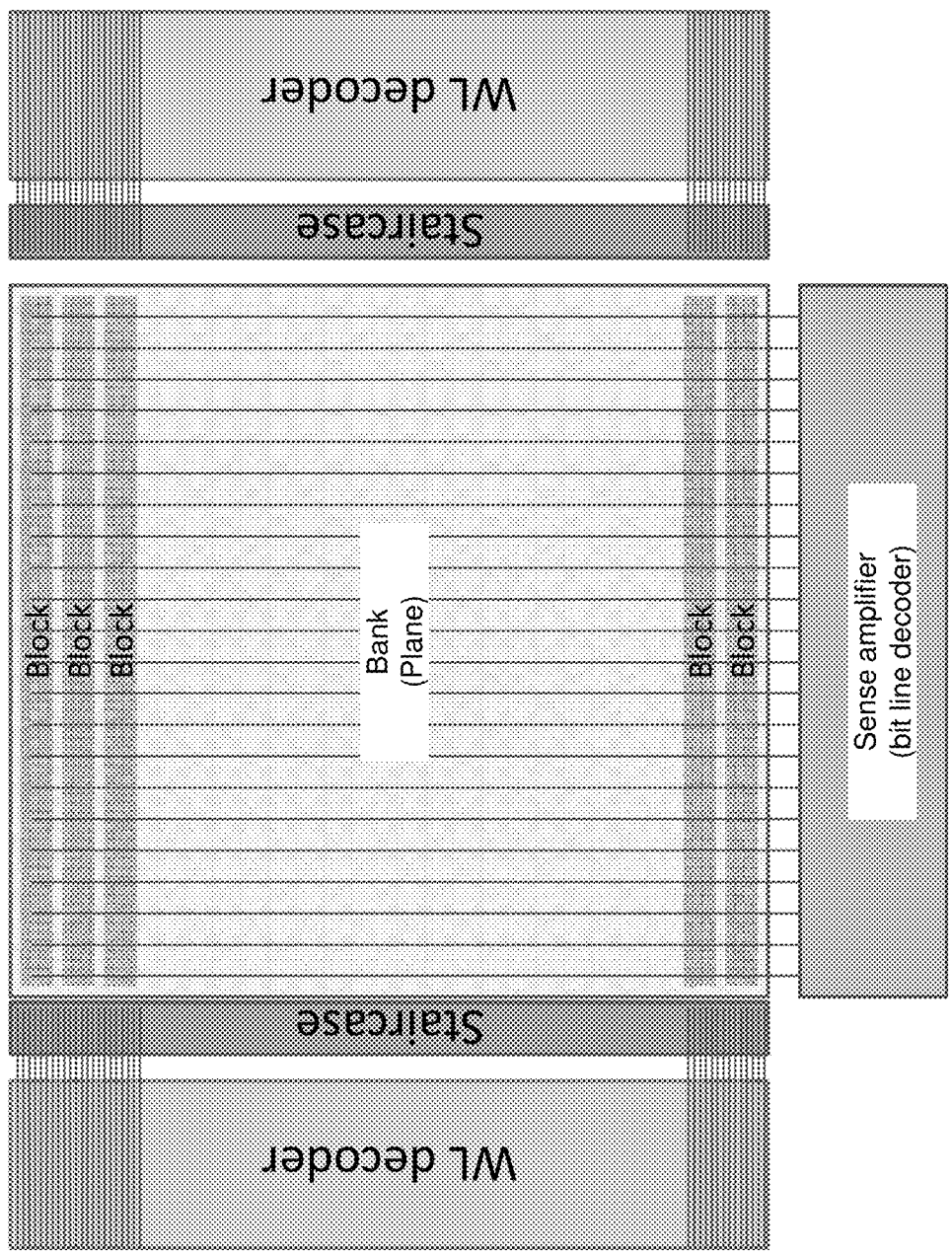
FIG. 1 is a layout of a prior art three-dimensional (3D) NAND chip in which the word line decoder circuitry and the bit line decoder circuitry are located in areas that are separate from the area of the array of memory cells.
Figure 2:
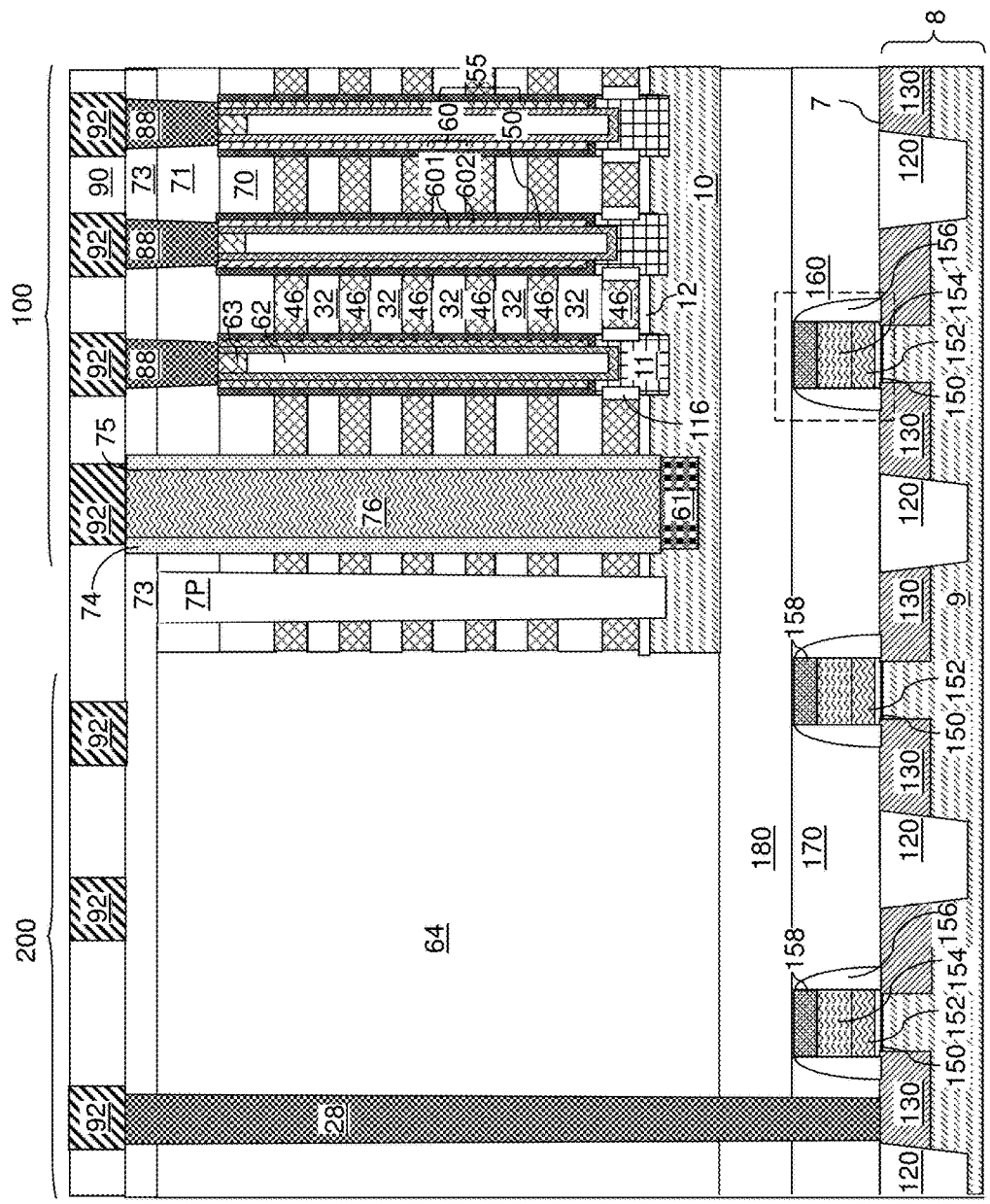
FIG. 2 is a vertical cross-sectional view of a first exemplary device structure containing a 3D NAND stacked memory device according to embodiments of the present disclosure.
Figure 3:
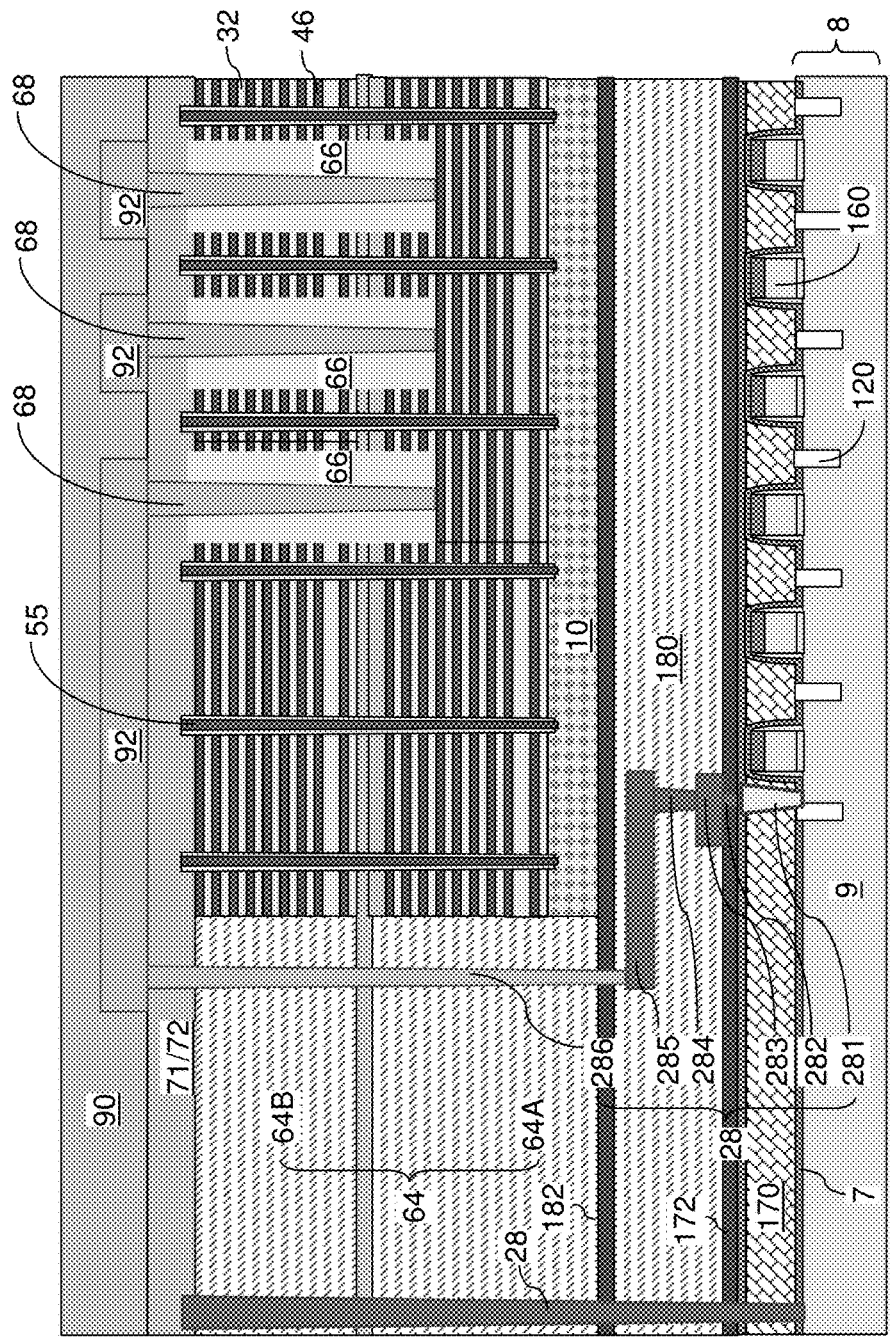
FIG. 3 is a vertical cross-sectional view of a second exemplary device structure containing a 3D NAND stacked memory device according to an embodiment of the present disclosure.
Figure 4:
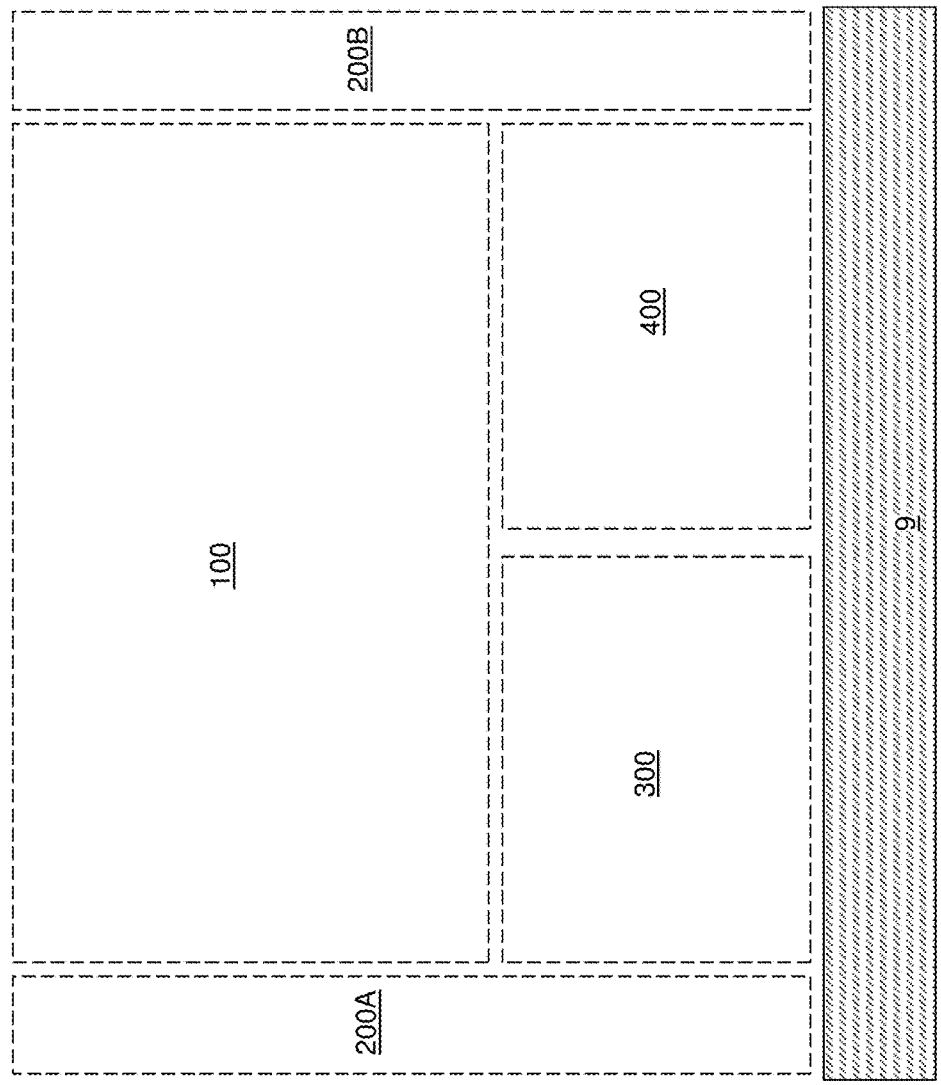
FIG. 4 is a schematic vertical cross-sectional view of the first and second exemplary device structures according to an embodiment of the present disclosure.
Figure 5:
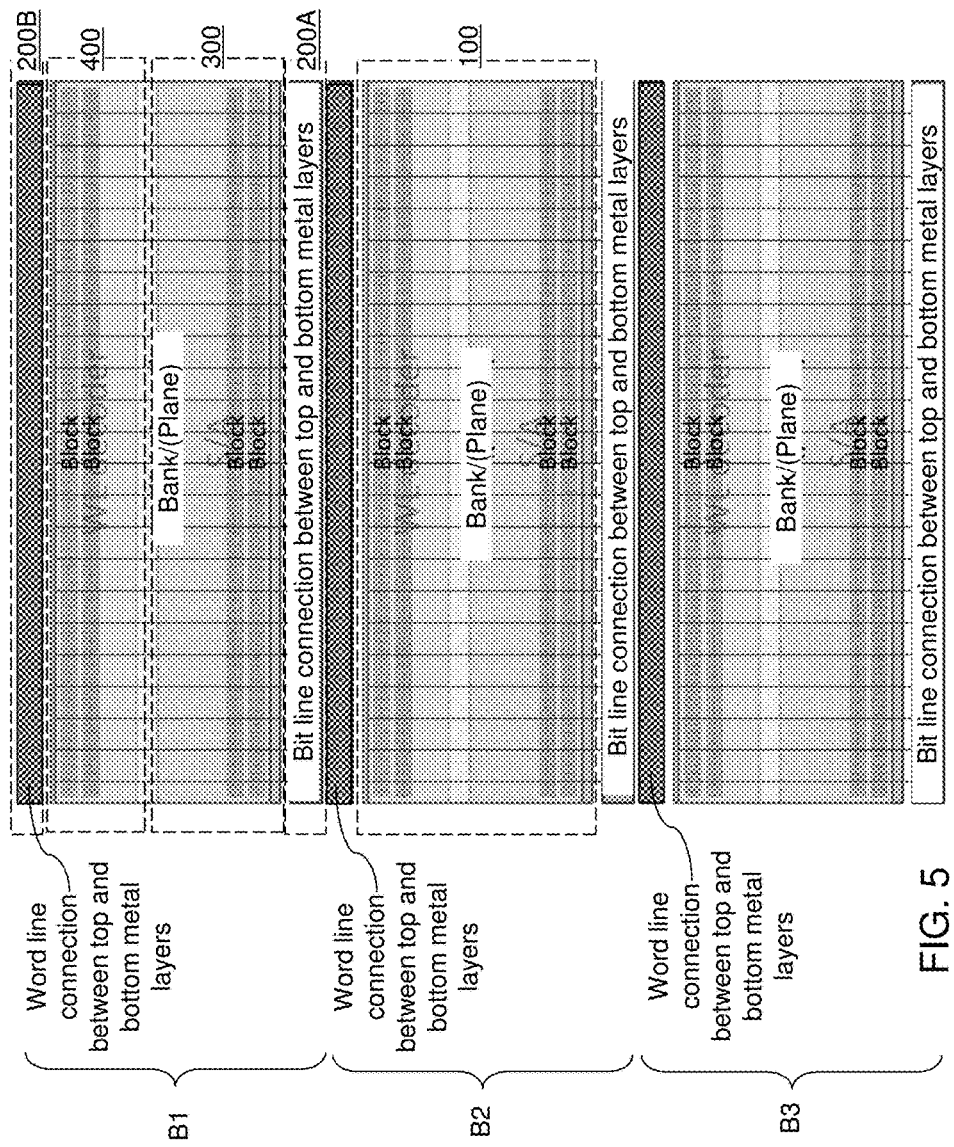
FIG. 5 is a first exemplary layout in which the word line decoder circuitry and the bit line decoder circuitry are located underneath an array of memory cells according to an embodiment of the present disclosure.
Figure 6:
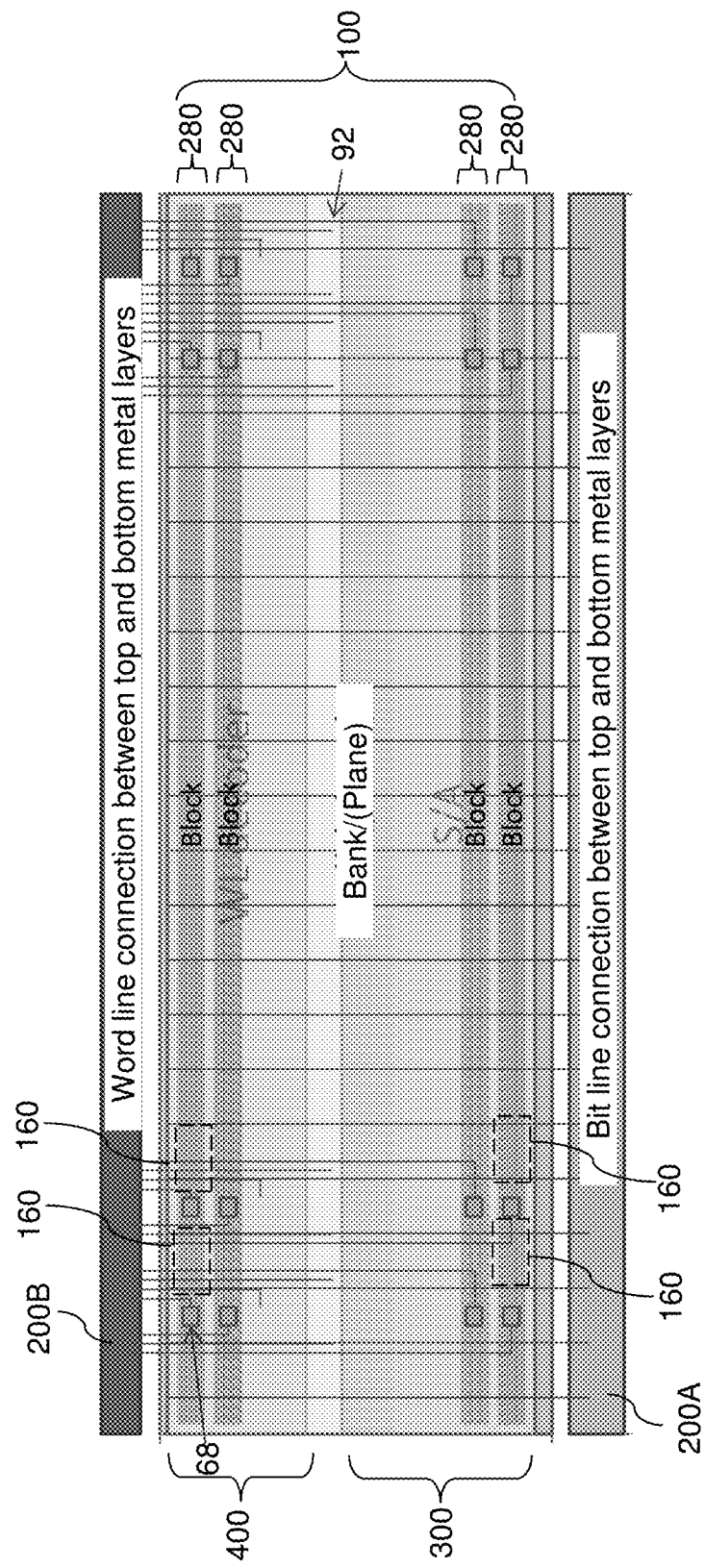
FIG. 6 is a magnified view of a plane of memory stack structures in the first exemplary layout.

Referring collectively to FIGS. 2-6, exemplary device structures containing a 3D NAND stacked memory device are illustrated in various views. FIG. 2 shows a vertical cross-sectional view of a first exemplary device structure containing a 3D NAND stacked memory device according to embodiments of the present disclosure. FIG. 3 shows a vertical cross-sectional view of a second exemplary device structure containing a 3D NAND stacked memory device according to an embodiment of the present disclosure. FIG. 4 is a schematic vertical cross-sectional view of the first and second exemplary device structures that illustrates locations of vertical interconnection regions 200 for connection to a word line decoder circuitry and a bit line decoder circuitry according to an embodiment of the present disclosure. The vertical interconnection regions 200 can include bit line vertical interconnection regions 200A that include first sets of conductive interconnection structures 28, which provide electrical connection between the bit lines and the bit line decoder circuitry 300. The vertical interconnection regions 200 can further include word line vertical interconnection regions 200B that include second sets of conductive interconnection structures 28, which provide electrical connection between the word lines and the word line decoder circuitry 400. FIG. 5 illustrates a first exemplary layout in which the word line decoder circuitry 400 and the bit line decoder circuitry 300 are located underneath an array of memory cells according to an embodiment of the present disclosure. FIG. 6 is a magnified view of a bank of memory cells in the first exemplary layout.

In the exemplary device structures of embodiments of the present disclosure, the word line decoder circuitry 400 is formed between a top surface of the substrate 8 and a bottom surface of a memory cell array 100 including memory stack structures 55. As used herein, a "memory cell array" refers to an array of multiple array cells, which can be arranged in a three-dimensional array that includes a two-dimensional array of vertically extending NAND strings. The word line decoder circuitry 400 can be formed within an area that overlaps with a first portion of the area of the memory cell array 100 including the memory stack structures 55. The bit line decoder circuitry 300 is formed between the surface of the substrate 8 and the bottom surface of the memory cell array 100 including the memory stack structures 55. The bit line decoder circuitry 300 can be formed within an area that overlaps with a second portion of the area of the memory cell array 100 including the memory stack structures 55.

The first portion and the second portion of the area of the array of the memory stack structures 55 may be mutually exclusive of each other. The memory cell array 100 including the memory stack structures 55 can have a rectangular area. In an illustrative example, the rectangular area can have a first side on the order of about 4 nm~8 nm such as from 5 nm to 6 nm, and a second side on the order of about 1 nm~4 nm such as from 1.5 nm to 3 nm, although the lateral dimensions of the rectangular may be adjusted as needed. The longer sides of the rectangular area are employed to provide bit line connections therethrough and word line connections therethrough according to embodiments of the present disclosure. Thus, unlike prior art devices in which shorter sides of a rectangular area of an array of memory stack structures must be employed to provide either word line connection therethrough or bit line connections therethrough, the devices of embodiments of the present disclosure can employ one long side of the rectangle of the area of the memory cell array 100 including the memory stack structures 55 for bit line connections therethrough and another long side of the rectangle of the area of the memory cell array 100 including the memory stack structures 55 for word line connections, thereby reducing the wiring density and the required number of metal levels for forming the metal interconnect structures that function as the word line connections and bit line connections.

The exemplary device structure includes a substrate 8, which can be a semiconductor substrate. Various semiconductor devices can be formed on, or over, the substrate 8 employing methods known in the art. The substrate 8 can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 7, which can be, for example, a topmost surface of the substrate semiconductor layer 9. The major surface 7 can be a semiconductor surface. In one embodiment, the major surface 7 can be a single crystalline semiconductor surface. In one embodiment, the substrate 8 is a silicon wafer containing a doped well (e.g., p-well) substrate semiconductor layer 9.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well substrate semiconductor layer 9 can be formed within the substrate 8.

Semiconductor devices for the word line decoder circuitry 400 and the bit line decoder circuitry 300 can be formed over the substrate semiconductor layer 9. The semiconductor device can include various field effect transistors and additional devices (such as resistors, capacitors, and/or diodes) that are needed to provide the full functionality for the word line decoder circuitry 400 and the bit line decoder circuitry 300. The word line decoder circuitry 400 includes switches for activating a respective word line for the memory stack structures 55, and has an areal overlap with the area of the array of memory stack structures 55 in a plan view (such as FIGS. 5 and 6). The bit line decoder circuitry 300 includes switches for activating a respective bit line for the memory stack structures 55, and having an areal overlap with the area of the array of memory stack structures 55 in the plan view.

In an illustrative example, shallow trench isolation structures 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner and a second dielectric liner can be optionally formed. Each of the dielectric liners (not shown) may be optionally employed, which can include a silicon oxide layer, a silicon nitride layer, and/or a dielectric metal oxide layer.

Each block 280 of memory stack structures 55 can comprise a plurality of clusters 160 of memory stack structures 55 laterally spaced by word line contact via structures 68 contacting a respective electrically conductive layer 46 from above. The plurality of clusters 160 of memory stack structures 55 can be in a one-dimensional array extending along a horizontal direction parallel to a lengthwise direction of the through-stack contact via structures 76.

A dielectric material such as silicon oxide can be deposited over the at least one semiconductor device, and can be subsequently planarized to form a planarization dielectric layer 170. In one embodiment the planarized top surface of the planarization dielectric layer 170 may be coplanar with a top surface of the gate structures (150, 152, 154, 158). Contact level conductive interconnection structures 281, which as conductive via structures, can be formed through the planarization dielectric layer.

An optional first dielectric cap layer 172 may be formed over the planarization dielectric layer 170. The first dielectric cap layer 172, if present, can include a dielectric material such as silicon nitride, and may be employed as an etch stop layer. Optionally, cap level conductive interconnection structures 282, which may be conductive via structures or conductive line structures, can be formed through the first dielectric cap layer 172.

At least one lower dielectric material layer 180 can be formed over the planarization dielectric layer 170. The at least one lower dielectric material layer 180 is herein referred to as at least one lower-interconnect-level dielectric material layer. The at least one lower dielectric material layer 180 can include a dielectric material such as doped silicate glass, undoped silicate glass, organosilicate glass, porous derivatives thereof, and/or stacks thereof. Lower-interconnect-level conductive interconnection structures (283, 284, 285), which may be conductive via structures or conductive line structures, can be formed through the at least one lower dielectric material layer 180. The at least one lower dielectric material layer 180 overlies the word line decoder circuitry 400 and the bit line decoder circuitry 300.

An optional second dielectric cap layer 182 may be formed over the at least one lower dielectric material layer 180. The second dielectric cap layer 182, if present, can include a dielectric material such as silicon nitride, and may be employed as an etch stop layer.

A semiconductor material layer 10 can be formed over the at least one lower dielectric material layer 180 by deposition of a polycrystalline semiconductor material (such as polysilicon) or by transferring the semiconductor material layer 10 (which may be single crystalline or polycrystalline) from a carrier substrate that is subsequently detached (for example, employing a hydrogen implanted layer and an anneal process that induces separation of the semiconductor material layer 10 from the carrier substrate).

A dielectric liner 12 can be formed above the semiconductor material layer 10. The dielectric liner 12 can be, for example, silicon oxide layer or a dielectric metal oxide layer. The dielectric liner 12 can be employed as a gate dielectric for source side select transistors that are subsequently formed and are employed to select a set of semiconductor channels to be activated during operation of a NAND array.

A stack of alternating layers of a first material and a second material different from the first material is formed over a top surface of the semiconductor material layer 10. The stack of alternating layers form an alternating stack of insulating layers 32 and spacer material layers that vertically separate the insulating layers 32. In one embodiment, the first material can be an insulator material that forms the insulating layers 32, and the second material can be a conductive material that forms conductive line structures that can include electrically conductive layers 46. Alternatively, the first material can be an insulator material that forms insulating layers 32, and the second material can be a sacrificial material that is deposited as sacrificial layers, and is at least partly replaced with a conductive material to form electrically conductive layers 46 after formation of memory stack structures 55. Portions of the alternating stack in the vertical interconnection regions 200 can be removed to form cavities, which can be filled with a dielectric material to form dielectric material portions 64.

Memory openings can be formed through the alternating stack of the insulating layers 32 and the spacer material layers (which may be electrically conductive layers 46 or sacrificial material layers) employing methods known in the art. A semiconductor material portion 11 can be formed at a bottom portion of each memory opening directly on physically exposed surfaces of the semiconductor material layer 10, for example, by selective deposition of a semiconductor material.

The alternating stack of the insulating layers 32 and the spacer material layers may be formed as a single tier structure through which the memory openings are formed in a single anisotropic etch process, or can be formed as multiple tier structures. In case the alternating stack is formed as multiple tier structures, multiple sets of memory openings can be formed such that each set of memory openings is formed through a respective tier structure that includes a respective alternating stack of insulating layers 32 and spacer material layers, and each set of memory openings is aligned to another set of underlying memory openings, if present. In this case, the dielectric material portions 64 can include multiple tier-level dielectric material portions (64A, 64B), each located at the level of the respective tier structure.

Memory stack structures 55 can be formed in remaining volumes of the memory openings. Each memory stack structure 55 can include at least a memory film 50, a semiconductor channel 60, and optionally a dielectric core 62 in case the semiconductor channel 60 does not fill the entire volume within the memory film 50 (i.e., has a cylindrical shape). Each memory film 50 can include, from outside to inside, a blocking dielectric layer, a charge trapping layer or a plurality of vertically spaced floating gate electrodes, and a tunneling dielectric layer. The semiconductor channel 60 may include a first semiconductor channel layer 601 and a second semiconductor channel layer 602. A drain region 63 can be formed on top of each semiconductor channel 60. At least one contact level dielectric layer (71, 73) and dielectric pillars 7P may be formed as needed.

Backside trenches extending through the alternating stack can be formed. If the spacer material layers are formed as sacrificial material layers, the sacrificial material layers can be replaced with electrically conductive layers 46. An annular dielectric spacer 116 may be formed around each semiconductor material portion 11 during replacement of the sacrificial material layers with the electrically conductive layers 46. A source region 61 can be formed underneath each backside trench by implanting electrical dopants into portions of the semiconductor material layer 10 that underlies the backside trenches.

An insulating spacer 74 can be formed at a periphery of each backside trench, and the remaining volumes of the backside trenches can be filled with at least one conductive material to form through-stack contact via structures 76, which can be source contact via structures. Each through-stack contact via structure 76 can be formed through the alternating stack (32, 46). The array of memory stack structures 55 can includes multiple blocks 280 of memory stack structures 55 that are laterally spaced apart from one another by the through-stack contact via structures 76. In one embodiment, the through-stack contact via structures 76 can extend along the lengthwise direction of the memory cell array 100 (i.e., the 3D NAND bank), thereby separating the blocks 280 of memory stack structures 55 along directions that are perpendicular to the lengthwise direction of the 3D NAND bank. The lengthwise direction of the 3D NAND bank is the horizontal direction along which the longer sides of the rectangle defining the area of the memory cell array 100.

The semiconductor material layer 10 can include horizontal semiconductor channels adjoined to the vertical semiconductor channels 60 of the memory stack structures 55 through the semiconductor material portions 11 (in case the semiconductor material portions 11 are present), or directly adjoined to (i.e., contacting) the vertical semiconductor channels 60 of the memory stack structures 55 (in case the semiconductor material portions 11 are omitted). The horizontal semiconductor channels can extend within the semiconductor material layer 10 from the bottom of the semiconductor material portions 11 (which are portions of semiconductor channels) to an adjacent source region 61.

At least one upper dielectric material layer 90 can be formed over the memory cell array 100 including the memory stack structures 55. The at least one upper dielectric material layer 90 is herein referred to as at least one upper-interconnect-level dielectric material layer. The at least one upper dielectric material layer 90 can include a dielectric material such as doped silicate glass, undoped silicate glass, organosilicate glass, porous derivatives thereof, and/or stacks thereof. Upper-interconnect-level conductive interconnection structures including upper-interconnect-level metal line structures 92 can be formed through the at least one upper dielectric material layer 90. The upper-interconnect-level conductive interconnect structure may optionally include conductive via structures (not shown) and/or additional metal lines (not shown) that are embedded in the at least one upper dielectric material layer 90.

Thus, the word line decoder circuitry 400 and the bit line decoder circuitry 300 can be located underneath the array of memory stack structures 55 and above the substrate 8. The word line decoder circuitry 400 and the bit line decoder circuitry 300 can be formed adjacent to each other in the same level employing the same set of processing steps.

The memory cell array 100 is formed over the area of a word line decoder circuitry 400 and over the area of a bit line decoder circuitry 300. The memory cell array 100 includes an alternating stack of insulating layers 32 and electrically conductive layers 46 and an array of memory stack structures 55 extending through the alternating stack (32, 46). Each of the memory stack structures 55 comprises charge storage regions (which can be present as discrete portions within the memory film 50 at each level of the electrically conductive layers 46) and a vertical semiconductor channel 60. The electrically conductive layers 46 can comprise word lines for the memory stack structures 55.

In one embodiment, the array of memory stack structures 55 in the memory cell array 100 can comprise multiple blocks 280 of memory stack structures 55 that are laterally spaced apart from one another by the through-stack contact via structures 76, which extend through the alternating stack (32, 46) to a top surface of the semiconductor material layer 10. Each block 280 of memory stack structures 55 can laterally extend along a lengthwise direction of the block 280, which is the same as the lengthwise direction of the rectangle defining the area of the memory cell array 100.

Vertical electrical connection between the word line decoder circuitry 400 and the electrically conductive layers 46 of the memory cell array 100 can be provided in the word line vertical interconnection regions 200B. Each of the word line vertical interconnection region 200B can be a first rectangular region that is laterally offset from the area of the array of memory stack structures 55 (i.e., from the area of the memory cell array 100) and extends along the lengthwise direction of the memory cell array 100. In one embodiment, the electrical connection between the word lines and the word line decoder circuitry 400 can comprise word line contact via structures 68 contacting a respective electrically conductive layer 46 from above and located between a respective neighboring pair of through-stack contact via structures 76 (i.e., within a block 280).

Multiple sets of at least one conductive interconnection structure 28 can be formed through the at least one lower dielectric material layer 180 and the dielectric material portion 64 within the area of the word line vertical interconnection regions 200B. Each set of at least one conductive interconnection structure 28 can contact a node of a respective device in the word line decoder circuitry 400. The node of the respective device in the word line decoder circuitry 400 can be the node of any semiconductor device (such as field effect transistors, diodes, capacitors, etc.). For example, the node can be selected from a source region of a field effect transistor, a drain region of a transistor, and a gate electrode of a field effect transistor. Some sets of at least one conductive interconnection structure 28 can include a single contact via structure that extends through the dielectric material portion 64, the at least one lower dielectric material layer 180, and optionally through the planarization dielectric layer 170 to a node of a respective device in the word line decoder circuitry 400.

Further, some other sets of at least one conductive interconnection structure 28 may include a plurality of conductive interconnection structures (281, 282, 283, 284, 285, 286). For example, one or more sets among the sets of at least one conductive interconnection structure can comprise a stack level connector via structure 286 extending from above the horizontal plane including the top surface of the alternating stack (32, 46) to another horizontal plane including the bottom surface of the alternating stack (32, 46), at least one connector metal line (283, 285) underlying the alternating stack (32, 42) and located at least partly within the area of the memory cell array 100 in a plan view, and at least one connector via structure (281, 282, 284) underlying the alternating stack (32, 42). In one embodiment, a set of at least one conductive interconnection structure 28 may include a stack level connector via structure 286, lower-interconnect-level conductive interconnection structures (283, 284, 285), a cap level conductive interconnection structure 282, and a contact level conductive interconnection structure 281.

The word line contact via structures 68 are formed partly through the alternating stack (32, 42). Word line contact via structures 68 can contact a respective electrically conductive layer 46, and can extend above the alternating stack (32, 46). Within each block 280, a set of word line contact via structures 68 extending to different electrically conductive layers 46 can provide electrical contact to each electrically conductive layer 46. Each word line contact via structure 68 can be formed within a respective contact via cavity, which is filled with a respective insulating spacer 66 at a peripheral portion and is filled with a respective word line contact via structure 68 at a center portion.

Metal line structures 92 can be formed in the at least one upper dielectric material layer 90. A subset of the metal line structures 92 can contact respective word line contact via structures 68 and respective sets of at least one conductive interconnection structure 28. In one embodiment, each metal line structure 92 employed to provide electrical connection between the word lines (as embodied as the electrically conductive layers 46) and the word line decoder circuitry 400 can contact a respective word line contact via structure 68 and a respective set of at least one conductive interconnection structure 28.

Vertical electrical connection between the bit line decoder circuitry 300 and the electrically conductive layers 46 of the memory cell array 100 can be provided in the bit line vertical interconnection regions 200A. Each of the bit line vertical interconnection region 200A can be a second rectangular region that is laterally offset from the area of the array of memory stack structures 55 (i.e., from the area of the memory cell array 100) on the opposite side of the word line vertical interconnection region 200B and extends along the lengthwise direction of the memory cell array 100.

Additional sets of at least one conductive interconnection structure 28 can be formed through the at least one lower dielectric material layer 180 and the dielectric material portion 64 within the area of the bit line vertical interconnection regions 200A. Each additional set of at least one conductive interconnection structure 28 can contact a node of a respective device in the bit line decoder circuitry 300. The node of the respective device in the bit line decoder circuitry 300 can be the node of any semiconductor device (such as field effect transistors, diodes, capacitors, etc.). For example, the node can be selected from a source region of a field effect transistor, a drain region of a transistor, and a gate electrode of a field effect transistor. Some additional sets of at least one conductive interconnection structure 28 can include a single contact via structure that extends through the dielectric material portion 64, the at least one lower dielectric material layer 180, and optionally through the planarization dielectric layer 170 to a node of a respective device in the bit line decoder circuitry 300.

Further, some other additional sets of at least one conductive interconnection structure 28 may include a plurality of conductive interconnection structures (281, 282, 283, 284, 285, 286). For example, one or more sets among the additional sets of at least one conductive interconnection structure can comprise a stack level connector via structure 286 extending from above the horizontal plane including the top surface of the alternating stack (32, 46) to another horizontal plane including the bottom surface of the alternating stack (32, 46), at least one connector metal line (283, 285) underlying the alternating stack (32, 42) and located at least partly within the area of the memory cell array 100 in a plan view, and at least one connector via structure (281, 282, 284) underlying the alternating stack (32, 42). In one embodiment, a set of at least one conductive interconnection structure 28 may include a stack level connector via structure 286, lower-interconnect-level conductive interconnection structures (283, 284, 285), a cap level conductive interconnection structure 282, and a contact level conductive interconnection structure 281.

The metal line structures 92 can include bit lines that are electrically shorted to respective drain regions 63 overlying the memory stack structures 55. Drain contact via structures 88 can provide electrical contact (that provide electrical shorts) between each pair of an underlying drain region 63 and an overlying metal line structure 92, which may be a bit line extending into the area of a bit line vertical interconnection region 200A. A subset of the metal line structures 92 can comprise, or can be electrically shorted to, bit lines of the memory cell array 100 and respective sets of at least one conductive interconnection structure 28 that are electrically shorted to nodes of the bit line decoder circuitry 300.

A subset of the upper-interconnect-level metal line structures 92 (which are herein referred to as upper-interconnect-level word line connectors) can be employed to provide electrical connection between the word line contact via structures 68 and each set of at least one conductive interconnection structure 28 that provides an electrically conductive path to the word line decoder circuitry 400. The upper-interconnect-level word line connectors are located above the array of memory stack structures 55 and extend along the same direction as the lengthwise direction of the bit lines.

The lengthwise directions of the bit line vertical interconnection regions 200A can have respective first rectangular areas, and the word line vertical interconnection regions 200B can have respective second rectangular areas. The lengthwise direction of each first rectangular area (i.e., each area of the bit line vertical interconnection region 200A) can be parallel to the lengthwise direction of the each second rectangular area (i.e., each area of the word line vertical interconnection region 200B). The upper-interconnect-level word line connectors (which is a first subset of the upper-interconnect-level metal line structures 92) laterally extend from above the word line contact via structures 68 within the block 280 of memory stack structures 55 into the word line vertical interconnection region 200B at the level of the at least one upper dielectric material layer 90. A subset of the upper-interconnect-level word line connectors passes over at least another block of memory stack structures 55. The bit lines (which is a second subset of the upper-interconnect-level metal line structures 92) laterally extend from above the memory stack structures 55 within each block 280 of memory stack structures 55 into the bit line vertical interconnection region 200A at the level of the at least one upper dielectric material layer 90. A subset of the bit lines passes over at least another block of memory stack structures 55. The upper-interconnect-level word line connectors and the bit lines can be parallel to each other, and can be perpendicular to the lengthwise directions of the bit line vertical interconnection regions 200A and the word line vertical interconnection regions 200B.

In the layout illustrated in FIGS. 5 and 6, a memory cell array 100 including an array of memory stack structures 55 can comprise multiple blocks 280 of memory stack structures 55. The multiple blocks 280 of memory stack structures 55 can be laterally spaced apart by through-stack contact via structures 76, and can laterally extend along a lengthwise direction of the respective block 280, which may be the same as the lengthwise direction of the memory cell array 100. Vertical electrical connection between the word line decoder circuitry 400 for the memory cell array 100 and the electrically conductive layers 46 (which are word lines of the 3D NAND memory device) can be provided in a first rectangular region (which is a word line vertical interconnection regions 200B) the that is laterally offset from the area of the array of memory stack structures 55 (i.e., the area of the memory cell array 100) and extends along the lengthwise direction of the memory cell array 100. Vertical electrical connection between the bit line decoder circuitry 300 for the memory cell array 100 and the bit lines of the memory stack structures 55 can be provided in a second rectangular region (which is a bit line vertical interconnection region 200A) that is laterally offset from the area of the memory stack structures 55 and extends along the lengthwise direction.

In one embodiment, the memory device can include multiple banks of memory cell arrays 100, and can include a periodic repetition of multiple instances of the array of memory stack structures 55, the first rectangular region, and the second rectangular region that are repeated along a direction perpendicular to the common lengthwise direction of the memory cell arrays 100.

Figure 7:
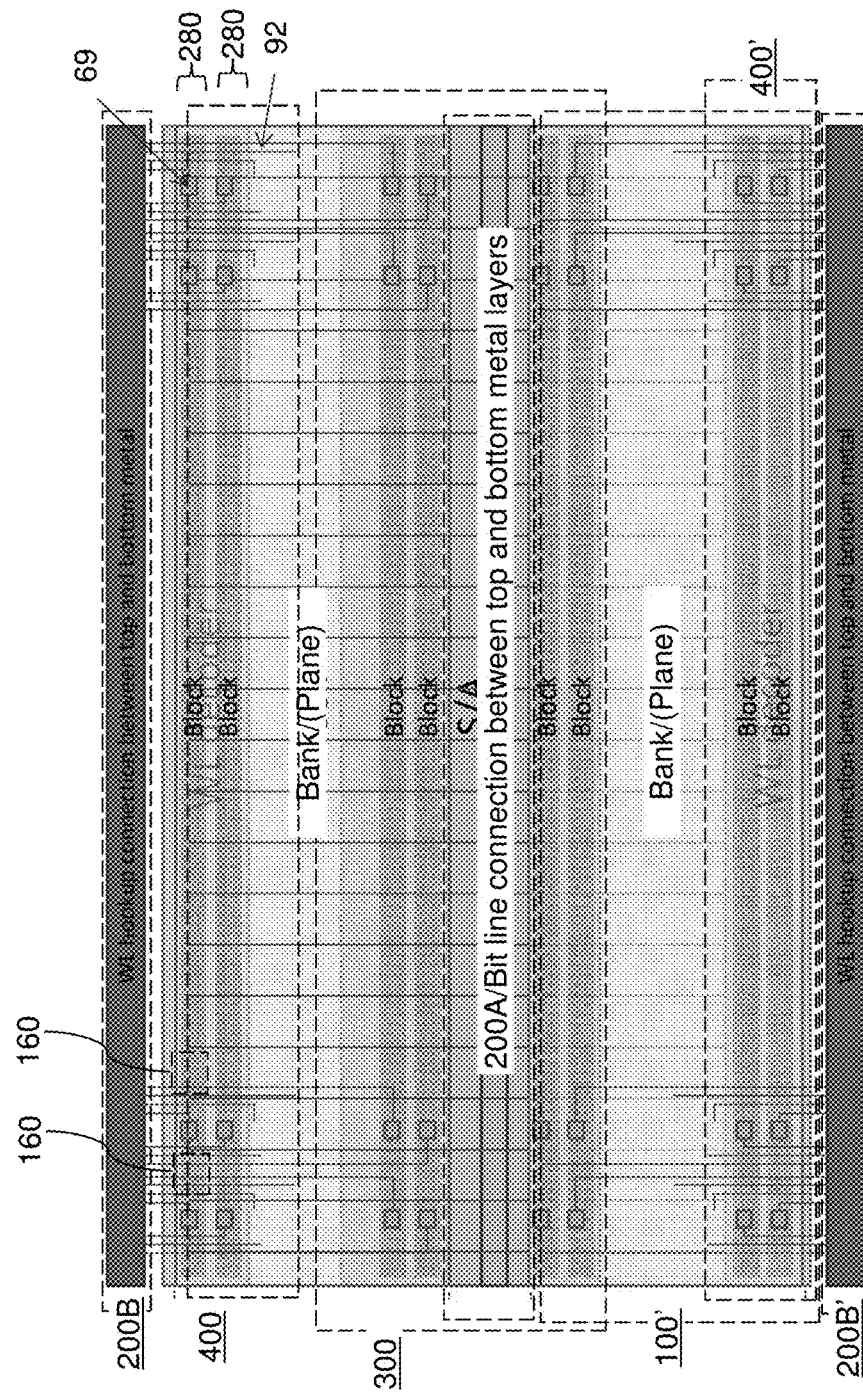
FIG. 7 is a second exemplary layout in which the word line decoder circuitry and the bit line decoder circuitry are located underneath an array of memory cells according to an embodiment of the present disclosure.

Referring to FIG. 7, a second exemplary layout is illustrated, in which the word line decoder circuitry 400 and the bit line decoder circuitry 300 are located underneath a memory cell array 100 such that each neighboring pairs of banks are mirror images of each other. In this case, a bit line decoder circuitry 300 can continuously extend from a region underneath a portion of one memory cell array 100 to another region underneath a portion of another memory cell array 100'. Alternatively or additionally, a word line decoder circuitry 400 can continuously extend from a region underneath a portion of one memory cell array 100 to another region underneath a portion of another memory cell array 100'. If more than three memory cell arrays 100 are provided, the bit line decoder circuitries 300 and the word line decoder circuitries 400 can alternate underneath the memory cell arrays 100 in a manner that each of the bit line decoder circuitries 300 and the word line decoder circuitries 400 straddle two memory cell arrays 100.

In this case, one array 100 of memory stack structures 55 (as embodied as a memory cell array 100) comprising multiple blocks 280 of memory stack structures 55 and an additional array 100' of memory stack structures 55 (as embodied as another memory cell array 100') comprising additional multiple blocks 280 of memory stack structures 55 can be formed. A first rectangular array region including an instance of the word line vertical connection region 200B can be formed on one side of a memory cell array 100 that is distal from the other memory cell array 100', i.e., on the side that is not adjacent to the other memory cell array 100'.

The two arrays (100, 100') of memory stack structures 55 can be laterally spaced from each other by a second rectangular region including an instance of the bit line vertical connection region 200A. A third rectangular region can be located at the opposite side of the first rectangular array region and include another word line vertical connection region 200B'. The third rectangular region can include vertical connection between an additional word line decoder circuitry 400' including switches for activating a respective word line for the memory stack structures 55 of the additional array 100' of memory stack structures 55. The additional word line decoder circuitry 400' can be located underneath the additional array 100' of memory stack structures 55 and above the substrate 8, and can have an areal overlap with the area of the additional array 100' of memory stack structures 55 in the plan view. The second rectangular region can have an areal overlap with the bit line decoder circuitry 200A, which actives the bit lines of the additional array 100' of memory stack structures 55.

Figure 8:
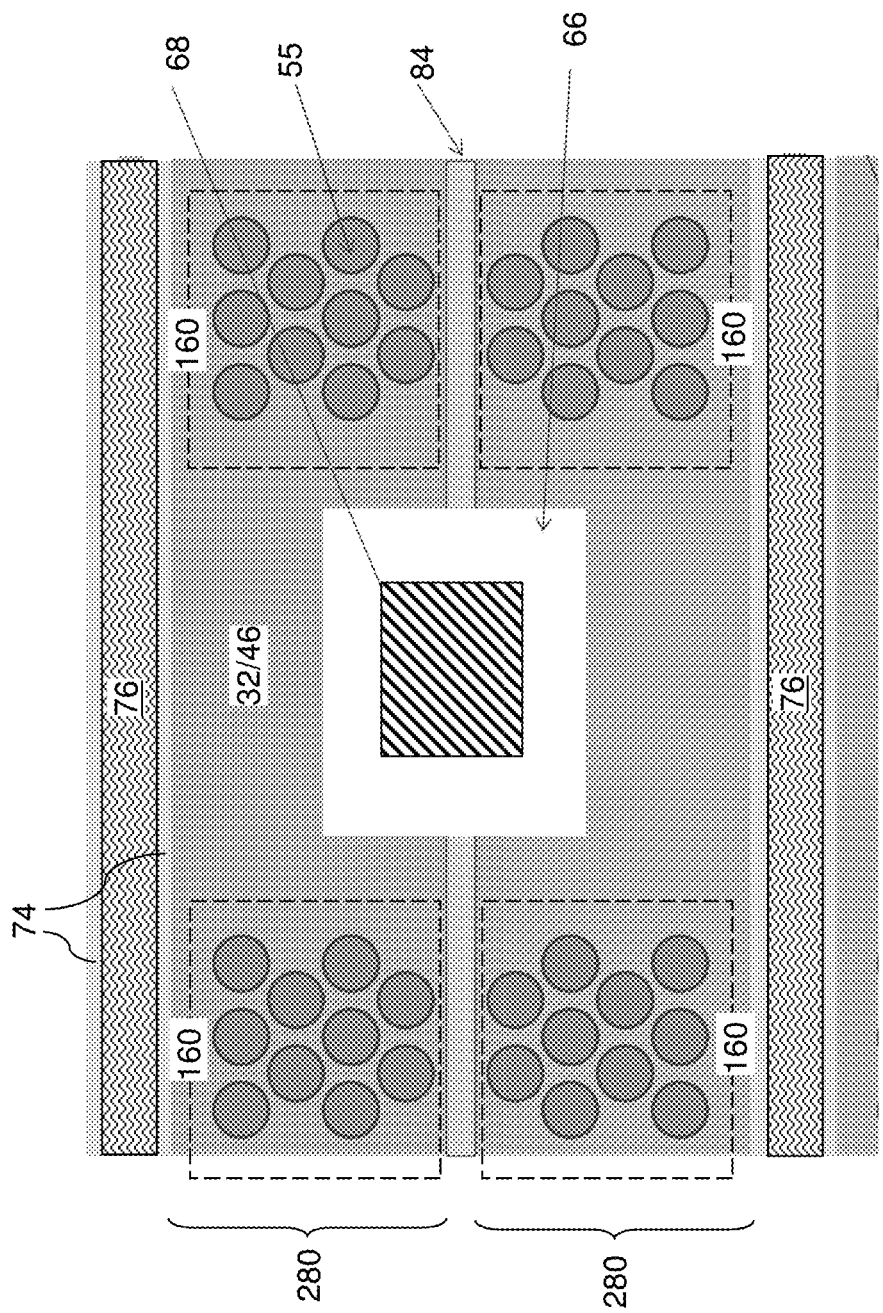
FIG. 8 is magnified view of a region including a word line contact via structure according to an embodiment of the present disclosure.

Referring to FIG. 8, a magnified view of a region including a word line contact via structure 68 is illustrated. The word line contact via structure 68 is not formed in a staircase region, which is not employed for providing connections to word lines in the exemplary structures of the present disclosure. Instead, word line connection holes are formed within each block 280 of memory stack structures 55 employing various combinations of etch masks (701, 702, 704, 708, 716, 732).

Figure 9:
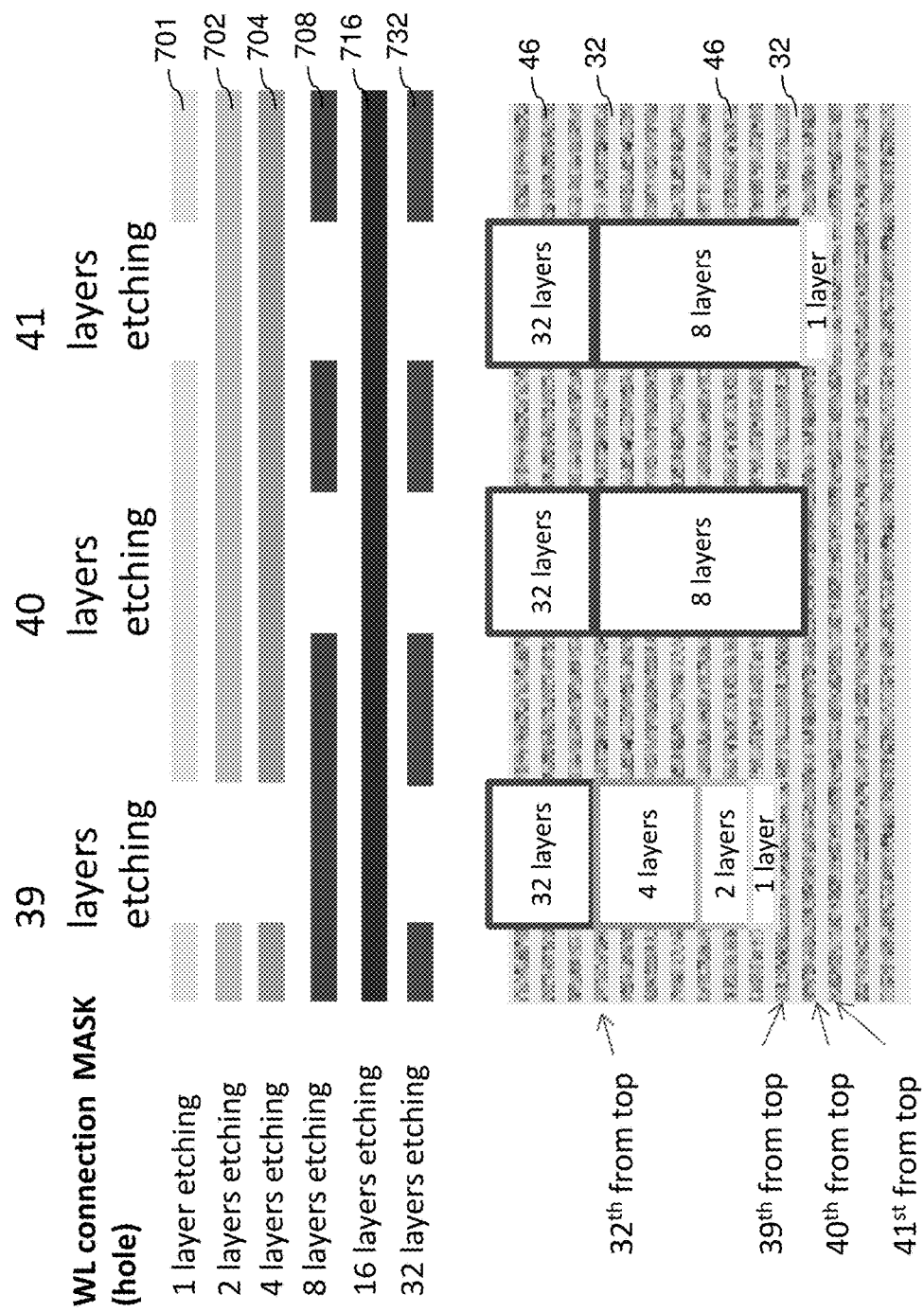
FIG. 9 is an illustration of a mask overlapping scheme for providing contact via cavities extending through an arbitrary number of pairs of electrically conductive layers and insulating layers according to an embodiment of the present disclosure.

Referring to FIG. 9, a mask overlapping scheme is illustrated, which can be employed to provide word line connection holes (which are contact via cavities) extending through an arbitrary number of pairs of electrically conductive layers 46 and insulating layers 32. Each word line connection hole can be formed employing a suitable combination of at least one etch mask among the set of etch masks. A subset of the openings in the etch masks can have overlaps with other openings in other etch masks. In case N etch masks are employed, up to $2^N-1$ pairs of electrically conductive layers 46 and insulating layers 32 can be etched by providing suitable overlaps among the openings through the various etch masks.

Combinations of etch masks having holes in different locations can be employed to form word line connection holes having different depths, i.e., extending to different electrically conductive layers 46. For example, the etch masks (701, 702, 704, 708. 716, 732) can include a 1-level etch mask 701 that is employed to etch a word line connection hole (which is a via cavity) that extends through a stack of one insulating layer 32 and one electrically conductive layer 46, or to extend a pre-existing word line connection hole by a stack of one insulating layer 32 and one electrically conductive layer 46. Further, the etch masks (701, 702, 704, 708, 716, 732) can include a 2-level etch mask 702 that is employed to etch a word line connection hole (which is a via cavity) that extends through a stack of two insulating layers 32 and two electrically conductive layer 46, or to extend a pre-existing word line connection hole by a stack of two insulating layers 32 and two electrically conductive layers 46. In addition, the etch masks (701, 702, 704, 708, 716, 732) can include a $2^k$-level etch mask 702 that is employed to etch a word line connection hole (which is a via cavity) that extends through a stack of $2^k$ insulating layers 32 and $2^k$ electrically conductive layer 46, or to extend a pre-existing word line connection hole by a stack of $2^k$ insulating layers 32 and $2^k$ electrically conductive layers 46. The number k can be any integer greater than 1, such as 2, 3, 4, 5, 6, etc. In one embodiment, the etch masks (701, 702, 704, 708, 716, 732) may be patterned photoresist layers, or may be patterned hard mask layers depending on the process integration scheme employed to form the various physical via cavities that embody the word line connection holes.

The positions of holes in the etch masks (701, 702, 704, 708, 716, 732) can overlap as needed to generate word line connection holes that extend through an arbitrary number of insulating layers 32 (and any electrically conductive layers 46 thereamongst). For example, to form a word line connection hole that extends through 39 insulating layers 32, a 32-level etch mask and an anisotropic etch process that etches through 32 alternating pairs of electrically conductive layers 46 and insulating layers 32 can be performed, a 4-level etch mask and an anisotropic etch process that etches through 4 alternating pairs of electrically conductive layers 46 and insulating layers 32 can be performed, a 2-level etch mask and an anisotropic etch process that etches through 2 alternating pairs of electrically conductive layers 46 and insulating layers 32 can be performed, and a 1-level etch mask and an anisotropic etch process that etches through 1 alternating pair of electrically conductive layers 46 and insulating layers 32 can be performed.

In another example, to form a word line connection hole that extends through 40 insulating layers 32, a 32-level etch mask and an anisotropic etch process that etches through 32 alternating pairs of electrically conductive layers 46 and insulating layers 32 can be performed, and an 8-level etch mask and an anisotropic etch process that etches through 8 alternating pairs of electrically conductive layers 46 and insulating layers 32 can be performed.

In yet another example, to form a word line connection hole that extends through 41 insulating layers 32, a 32-level etch mask and an anisotropic etch process that etches through 32 alternating pairs of electrically conductive layers 46 and insulating layers 32 can be performed, an 8-level etch mask and an anisotropic etch process that etches through 8 alternating pairs of electrically conductive layers 46 and insulating layers 32 can be performed, and a 1-level etch mask and an anisotropic etch process that etches through 1 alternating pair of electrically conductive layers 46 and insulating layers 32 can be performed.

Generally speaking, any integer that represents the number of insulating layers 32 that a given word line connection hole needs to pass through can be written in a binary code to determine whether a $2^k$-level etch mask and an accompanying anisotropic etch process that etches through $2^k$ alternating pairs of electrically conductive layers 46 and insulating layers 32 should be performed. If the binary code for the integer includes "1" at a j-th digit from the right, the corresponding $2^j$-level etch mask needs to have a hole at the location of the word line connection hole. If the binary code for the integer includes "0" at the j-th digit from the right, the corresponding $2^j$-level etch mask should not have a hole at the location of the word line connection hole.

During manufacturing, a set of word line connection holes can be formed employing multiple sets of processing steps. Each set of processing steps can include a first step of applying a photoresist layer, a second step of lithographically patterning the photoresist layer with a respective set of openings, a third step of etching through a respective number of pairs of electrically conductive layers 46 and insulating layers 32 in areas underlying the respective set of openings from the second step, and a fourth step of removing the photoresist layer.

In one embodiment, the respective number of pairs of electrically conductive layers 46 and insulating layers 32 differs from set to set among the multiple sets of processing steps. In one embodiment, a predominant subset of word line connection holes is formed employing at least two instances of the third step. As used herein, a "predominant subset" of the word line connection holes refers to more than 50% of the word line connection holes. In one embodiment, the array of memory stack structures 55 within a memory cell array 100 comprises multiple blocks 280 of memory stack structures 55, and each electrically conductive layer 46 can include a respective number of holes (i.e., the word line connection holes) therethrough within each block 280 of memory stack structures 55. The respective number of holes for a given electrically conductive layer 46 can be the same as a total number of electrically conductive layers 46 underlying the given electrically conductive layer 46. In this scheme, each electrically conductive layer 46 is contacted by a single word line contact via structure 68. If redundancy is provided through multiple word line contact via structures 68 per word line (i.e., a respective electrically conductive layer 46), the total number of holes through a given electrically conductive layer 46 can be the same as the number of underlying electrically conductive layers 46 times the multiplicity of the word line contact via structures 68 employed per electrically conductive layer 46.

Referring back to FIG. 8, an insulating spacer 66 can be formed within each word line connection hole by deposition of a conformal insulating material layer and an anisotropic etch that removes horizontal portions of the conformal insulating material layer. Each insulating spacer 66 is a remaining portion of the conformal insulating material layer. At least one conductive material can be deposited in the cavities laterally surrounded by the insulating spacers 66. Excess portions of the at least one conductive material can be removed from above the topmost dielectric material layer (such as the at least one contact level dielectric layer (71, 72) illustrated in FIG. 3), for example, by chemical mechanical planarization. Each remaining portion of the at least at least one conductive material filling the cavities constitute the word line contact via structures 68.

The electrical connection between the word lines and the word line decoder circuitry 400 can comprise word line contact via structures 68 contacting a respective electrically conductive layer 46 from above and located between a respective neighboring pair of through-stack contact via structures 76 (i.e., within a block 280). Each block 280 of memory stack structures 55 can comprise a plurality of clusters 160 of memory stack structures 55 laterally spaced by word line contact via structures 68 contacting a respective electrically conductive layer 46 from above. The plurality of clusters 160 of memory stack structures 55 can be in a one-dimensional array extending along a horizontal direction parallel to a lengthwise direction of the through-stack contact via structures 76.

In one embodiment, select drain gate electrodes embodied as at least one topmost electrically conductive layer 46 can be provided within each block 280 of memory stack structures 55. In this case, a drain-split shallow trench isolation structure 84 can divide the select drain gate electrodes into two electrically disjoined portions along the lengthwise direction of the block 280. In this case, the word line contact via structures 68 may pass through the drain-split shallow trench isolation structure 84.

In one embodiment, each word line contact via structure 68 extending through a same block 280 of memory stack structures 55 can contact a different electrically conductive layer 46 in the alternating stack (32, 46). In one embodiment, the word line contact via structures 68 extending through the same block 280 of memory stack structures 55 can be arranged as a one-dimensional array extending along a horizontal direction parallel to the lengthwise direction of the through-stack contact via structures 76 in a plan view. In the plan view, the locations of the word line contact via structures 68 can appear to be in a periodic array, although the heights of the word line contact via structures 68 (which can be seen in a vertical cross-sectional view) varies among the word line contact via structures 68.

The difference in the number of electrically conductive layers 46 that a neighboring pair of word line contact via structures 68 pass through may, or may not, be 1. Unlike prior art structures employing stepped surfaces and necessarily having a difference of exactly 1 in the number of electrically conductive layers that a neighboring pair of word line contact via structures pass through, the difference in the number of electrically conductive layers 46 that a neighboring pair of word line contact via structures 68 is not limited to 1 in embodiments of the present disclosure. Specifically, the difference in the number of electrically conductive layers 46 that two neighboring word line contact via structures 68 pass through may be any integer that facilitates wiring to the word line decoder circuitry 400, and can be integers greater than 1 and less than the total number of electrically conductive layers 46 less one.

According to various embodiments of the present disclosure, a memory device is provided, which comprises an alternating stack of insulating layers 32 and electrically conductive layers 46 located over a substrate, and an array of memory stack structures 55 extending through the alternating stack (32, 46). Each of the memory stack structures 55 comprises charge storage regions (as embodied as portion of a respective memory film 50) and a vertical semiconductor channel 60. The electrically conductive layers 46 comprise word lines for the memory stack structures 55. The memory device further comprises a word line decoder circuitry 400 including switches for activating a respective word line for the memory stack structures 55, located underneath the array of memory stack structures 55 and above the substrate 8, and having an areal overlap with an area of the array of memory stack structures 55 in a plan view.

In one embodiment, the array of memory stack structures 55 can comprise memory elements of a vertical NAND device, the electrically conductive layers 46 can comprise, or are electrically connected to, a respective word line of the vertical NAND device, the substrate 8 can comprises a silicon substrate, and the vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels. At least one end portion (such as a respective vertical semiconductor channel 60) of each of the plurality of semiconductor channels extends substantially perpendicular to a top surface of the substrate 8. The array of monolithic three-dimensional NAND strings can comprise a plurality of charge storage elements (as embodied as portions of the memory film 50). Each charge storage element can be located adjacent to a respective one of the plurality of semiconductor channel. The array of monolithic three-dimensional NAND strings can comprise a plurality of control gate electrodes having a strip shape extending substantially parallel to the top surface of the substrate 8. The plurality of control gate electrodes comprise at least a first control gate electrode located in the first device level and a second control gate electrode located in the second device level.

The 3D NAND structure includes CMOS devices under the memory cell array 100. Both a word line decoder circuitry 400 and a bit line decoder circuitry 300 (i.e., the sense amplifier (S/A) circuitry) can be under the memory cell array 100. Metal line structures 92 providing word line hookup can run primarily along the direction of the bit lines, which can be perpendicular to the lengthwise direction of the memory cell array 100. In one embodiment, both the word line decoder circuitry 400 and the bit line decoder circuitry 300 can be in the same device level located underneath the memory cell array 100, and can have respective areal overlaps with the area of the memory cell array 100. The word line connection structures 68 can be distributed within the memory cell array 100, and particularly, within each block 280 of memory stack structures 55 and between clusters 160 of memory stack structures 55 within the same block 280.

The embodiments of the disclosure provide several non-limiting advantages. By locating the driver circuits, such as the word line decoder and/or bit line decoder (e.g., sense amplifier) circuits below the memory array, the die size is reduced, which reduces the cost of the device. Furthermore, by using the above described device layout and vertical word line interconnection outside the memory array, the word line decoder may be located under the memory array and the stepped connection region may be omitted while utilizing a reduced number of metal interconnection layers, which reduces the device complexity and cost.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
    an alternating stack of insulating layers and electrically conductive layers located over a substrate;
    an array of memory stack structures extending through the alternating stack, wherein each of the memory stack structures comprises charge storage regions and a vertical semiconductor channel, and the electrically conductive layers comprise word lines for the memory stack structures;
    a word line decoder circuitry including switches for activating a respective word line for the memory stack structures, and located underneath the array of memory stack structures and above the substrate;
    a word line vertical interconnection region including multiple sets of at least one conductive interconnection structure, each set of at least one conductive interconnection structure electrically contacting a node of a respective device in the word line decoder circuitry;
    bit lines electrically connected to the vertical semiconductor channels through respective drain regions and extending over the array of memory stack structures;
    upper-interconnect-level word line connectors extending parallel to the bit lines over a portion of the array of memory stack structures, and electrically connecting a respective set of at least one conductive interconnection structure to the electrically conductive layers; and
    at least one element selected from:
    a first element of word line contact via structures contacting a respective electrically conductive layer and extending above the alternating stack and contacting a respective upper-interconnect-level word line connector;
    a second element of a combination of at least one dielectric material layer overlying the word line decoder circuitry, and a semiconductor material layer overlying the at least one dielectric material layer and underlying the alternating stack; and
    a third element of a bit line decoder circuitry including switches for activating a respective bit line for the memory stack structures, located underneath the array of memory stack structures and above the substrate and adjacent to the word line decoder circuitry, and having an areal overlap with the area of the array of memory stack structures in the plan view.

2. The memory device of claim 1, wherein the memory device comprises the first element.

3. The memory device of claim 2, wherein the node of the respective device in the word line decoder circuitry is selected from a source region of a field effect transistor, a drain region of a transistor, and a gate electrode of a field effect transistor.

4. The memory device of claim 2, wherein a set among the sets of at least one conductive interconnection structure comprises:
    a stack level connector via structure extending from above a horizontal plane including a top surface of the alternating stack to another horizontal plane including a bottom surface of the alternating stack;
    at least one connector metal line underlying the alternating stack; and
    at least one connector via structure underlying the alternating stack.

5. The memory device of claim 1, wherein the memory device comprises the second element.

6. The memory device of claim 5, wherein the semiconductor material layer comprises horizontal semiconductor channels adjoined to the vertical semiconductor channels of the memory stack structures.

7. The memory device of claim 5, wherein the array of memory stack structures comprises multiple blocks of memory stack structures that are laterally spaced apart from one another by through-stack contact via structures extending through the alternating stack to a top surface of the semiconductor material layer.

8. The memory device of claim 7, wherein electrical connection between the word lines and the word line decoder circuitry comprises word line contact via structures contacting a respective electrically conductive layer from above and located between a respective neighboring pair of through-stack contact via structures.

9. The memory device of claim 7, wherein:
    each block of memory stack structures comprises a plurality of clusters of memory stack structures laterally spaced by word line contact via structures contacting a respective electrically conductive layer from above; and the plurality of clusters of memory stack structures are in a one-dimensional array extending along a horizontal direction parallel to a lengthwise direction of the through-stack contact via structures.

10. The memory device of claim 9, further comprising at least one feature selected from:
a first feature that each word line contact via structure extending through a same block of memory stack structures contacts a different electrically conductive layer in the alternating stack; and
a second feature that wherein the word line contact via structures extending through a same block of memory stack structures are arranged as a one-dimensional array extending along a horizontal direction parallel to a lengthwise direction of the through-stack contact via structures in a plan view.

11. The memory device of claim 1, wherein the memory device comprises the third element.

12. The memory device of claim 11, wherein:
the bit line decoder circuitry has a first rectangular area;
the word line decoder circuitry has a second rectangular area; and
a lengthwise direction of the first rectangular area and a lengthwise direction of the second rectangular area are along a same horizontal direction.

13. The memory device of claim 11, wherein:
the array of memory stack structures comprises multiple blocks of memory stack structures that are laterally spaced apart by through-stack contact via structures and laterally extending along a lengthwise direction;
vertical electrical connection between the word line decoder circuitry and the electrically conductive layers is provided in a first rectangular region that is laterally offset from an area of the array of memory stack structures and extends along the lengthwise direction; and
vertical electrical connection between the bit line decoder circuitry and the bit lines of the memory stack structures is provided in a second rectangular region that is laterally offset from the area of the memory stack structures and extends along the lengthwise direction.

14. The memory device of claim 13, further comprising:
an additional array of memory stack structures comprising additional multiple blocks of memory stack structures and laterally spaced from the array of memory stack structures by the second rectangular region; and
a third rectangular region including vertical connection between an additional word line decoder circuitry including switches for activating a respective word line for the memory stack structures of the additional array of memory stack structures, located underneath the additional array of memory stack structures and above the substrate, and having an areal overlap with an area of the additional array of memory stack structures in the plan view,
wherein the second rectangular region comprises vertical electrical connection between bit lines of the additional array of memory stack structures and the bit line decoder circuitry.

15. The memory device of claim 13, wherein the memory device comprises a periodic repetition of multiple instances of the array of memory stack structures, the first rectangular region, and the second rectangular region.

16. The memory device of claim 1, wherein the memory device comprises the first feature.

17. The memory device of claim 1, wherein the memory device comprises the second feature the word line decoder circuitry has an areal overlap with an area of the array of memory stack structures in a plan view.

18. The memory device of claim 1, wherein the memory device comprises the third feature.

19. The memory device of claim 1, wherein the memory device comprises the fourth feature.

20. A method of forming a memory device, comprising:
forming a word line decoder circuitry over a substrate;
forming a memory cell array over the word line decoder circuitry, wherein:
the memory cell array includes an alternating stack of insulating layers and electrically conductive layers and an array of memory stack structures extending through the alternating stack,
each of the memory stack structures comprises charge storage regions and a vertical semiconductor channel,
the electrically conductive layers comprise word lines for the memory stack structures, and
the word line decoder circuitry includes switches for activating a respective word line for the memory stack structures;
forming a word line vertical interconnection region including multiple sets of at least one conductive interconnection structure, each set of at least one conductive interconnection structure contacting a node of a respective device in the word line decoder circuitry;
forming bit lines electrically connected to the vertical semiconductor channels through respective drain regions and extending over the array of memory stack structures; and
forming upper-interconnect-level word line connectors extending parallel to the bit lines over a portion of the array of memory stack structures, and electrically connecting a respective set of at least one conductive interconnection structure to the electrically conductive layers,
wherein the method comprises at least one feature selected from:
a first feature of performing a step of forming word line contact via structures contacting a respective electrically conductive layer and extending above the alternating stack, wherein the upper-interconnect-level word line connectors are formed on respective word line contact via structures;
a second feature of performing a step of forming at least one dielectric material layer overlying the word line decoder circuitry, and forming a semiconductor material layer over the at least one dielectric material layer, wherein the semiconductor material layer comprises horizontal semiconductor channels adjoined to the vertical semiconductor channels of the memory stack structures;
a third feature of performing a step of forming through-stack contact via structures through the alternating stack, wherein the array of memory stack structures comprises multiple blocks of memory stack structures that are laterally spaced apart from one another by the through-stack contact via structures;
a fourth feature of performing a step of forming a bit line decoder circuitry over the substrate, wherein the bit line decoder circuitry includes switches for activating a respective bit line for the memory stack structures, located underneath the array of memory stack structures and above the substrate and adjacent to the word line decoder circuitry, and having an areal overlap with the area of the array of memory stack structures in the plan view;
a fifth feature of performing a step of etching a set of word line connection holes employing multiple sets of processing steps, each set of processing steps comprising:
a first step of applying a photoresist layer,
a second step of lithographically patterning the photoresist layer with a respective set of openings,
a third step of etching through a respective number of pairs of electrically conductive layers and insulating layers in areas underlying the respective set of openings from the second step, and
a fourth step of removing the photoresist layer; and
a sixth feature that:
the array of memory stack structures comprises memory elements of a vertical NAND device,
the electrically conductive layers comprise, or are electrically connected to, a respective word line of the vertical NAND device,
the substrate comprises a silicon substrate,
the vertical NAND device comprises an array of monolithic three-dimensional NAND strings over the silicon substrate,
at least one memory cell in a first device level of the array of monolithic three-dimensional NAND strings is located over another memory cell in a second device level of the array of monolithic three-dimensional NAND strings,
the silicon substrate contains an integrated circuit comprising the word line driver circuit and a bit line driver circuit for the memory device, and
the array of monolithic three-dimensional NAND strings comprises:
a plurality of semiconductor channels, wherein at least one end portion of each of the plurality of semiconductor channels extends substantially perpendicular to a top surface of the substrate,
a plurality of charge storage elements, each charge storage element located adjacent to a respective one of the plurality of semiconductor channels, and
a plurality of control gate electrodes having a strip shape extending substantially parallel to the top surface of the substrate, the plurality of control gate electrodes comprise at least a first control gate electrode located in the first device level and a second control gate electrode located in the second device level.

21. The method of claim 20, wherein the method comprises the first feature.

22. The method of claim 21, wherein a set among the sets of at least one conductive interconnection structure comprises:
a stack level connector via structure extending from above a horizontal plane including a top surface of the alternating stack to another horizontal plane including a bottom surface of the alternating stack;
at least one connector metal line underlying the alternating stack; and
at least one connector via structure underlying the alternating stack.

23. The method of claim 20, wherein the method comprises the second feature.

24. The method of claim 20, wherein the method comprises the third feature.

25. The method of claim 24, further comprising forming word line contact via structures extending through an upper portion of the alternating stack to a respective electrically conductive layer, wherein:
each block of memory stack structures comprises a plurality of clusters of memory stack structures laterally spaced by the word line contact via structures; and
the plurality of clusters of memory stack structures are in a one-dimensional array extending along a horizontal direction parallel to a lengthwise direction of the through-stack contact via structures.

26. The method of claim 20, wherein the method comprises the fourth feature.

27. The method of claim 26, wherein:
the array of memory stack structures comprises multiple blocks of memory stack structures that are laterally spaced apart by through-stack contact via structures and laterally extending along a lengthwise direction;
vertical electrical connection between the word line decoder circuitry and the electrically conductive layers is provided in a first rectangular region that is laterally offset from an area of the array of memory stack structures and extends along the lengthwise direction; and
vertical electrical connection between the bit line decoder circuitry and the bit lines of the memory stack structures is provided in a second rectangular region that is laterally offset from the area of the memory stack structures and extends along the lengthwise direction.

28. The method of claim 27, further comprising:
forming an additional array of memory stack structures comprising additional multiple blocks of memory stack structures and laterally spaced from the array of memory stack structures by the second rectangular region; and
forming a third rectangular region including vertical connection between an additional word line decoder circuitry including switches for activating a respective word line for the memory stack structures of the additional array of memory stack structures, located underneath the additional array of memory stack structures and above the substrate, and having an areal overlap with an area of the additional array of memory stack structures in the plan view,
wherein the second rectangular region comprises vertical electrical connection between an additional bit line decoder circuitry for the additional array of memory stack structures and the bit lines of additional array of memory stack structures.

29. The method of claim 27, wherein the memory device comprises a periodic repetition of multiple instances of the array of memory stack structures, the first rectangular region, and the second rectangular region.

30. The method of claim 20, wherein the method comprises the fifth feature.

31. The method of claim 30, wherein:
the respective number of pairs of electrically conductive layers and insulating layers differs from set to set among the multiple sets of processing steps; and
a predominant subset of word line connection holes is formed employing at least two instances of the third step.

32. The method of claim 20, wherein the method comprises the sixth feature.

33. A memory device, comprising:
an alternating stack of insulating layers and electrically conductive layers located over a substrate;

an array of memory stack structures extending through the alternating stack, wherein each of the memory stack structures comprises charge storage regions and a vertical semiconductor channel, and the electrically conductive layers comprise word lines for the memory stack structures;

a word line decoder circuitry including switches for activating a respective word line for the memory stack structures, and located underneath the array of memory stack structures and above the substrate;

a word line vertical interconnection region including multiple sets of at least one conductive interconnection structure, each set of at least one conductive interconnection structure electrically contacting a node of a respective device in the word line decoder circuitry;

bit lines electrically connected to the vertical semiconductor channels through respective drain regions and extending over the array of memory stack structures; and upper-interconnect-level word line connectors extending parallel to the bit lines over a portion of the array of memory stack structures, and electrically connecting a respective set of at least one conductive interconnection structure to the electrically conductive layers, wherein the memory device comprises at least one feature selected from:

a first feature that the array of memory stack structures comprises multiple blocks of memory stack structures, and each electrically conductive layer includes a respective number of holes therethrough within each block of memory stack structures, wherein the respective number of holes for a given electrically conductive layer is the same as a total number of electrically conductive layers underlying the given electrically conductive layer;

a second feature that wherein the word line decoder circuitry has an areal overlap with an area of the array of memory stack structures in a plan view;

a third feature that the array of memory stack structures includes blocks of memory stack structures having a rectangular shape and laterally bounded by a pair of through-stack contact via structures, and the upper-interconnect-level word line connectors extend along a direction perpendicular to a lengthwise direction of the rectangular shapes of the blocks of memory stack structures; and a fourth feature that:

the array of memory stack structures comprises memory elements of a vertical NAND device, the electrically conductive layers comprise, or are electrically connected to, a respective word line of the vertical NAND device, the substrate comprises a silicon substrate, the vertical NAND device comprises an array of monolithic three-dimensional NAND strings over the silicon substrate, at least one memory cell in a first device level of the array of monolithic three-dimensional NAND strings is located over another memory cell in a second device level of the array of monolithic three-dimensional NAND strings, the silicon substrate contains an integrated circuit comprising the word line driver circuit and a bit line driver circuit for the memory device, and the array of monolithic three-dimensional NAND strings comprises:

a plurality of semiconductor channels, wherein at least one end portion of each of the plurality of semiconductor channels extends substantially perpendicular to a top surface of the substrate, a plurality of charge storage elements, each charge storage element located adjacent to a respective one of the plurality of semiconductor channels, and a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *